(12) United States Patent
Mahjouri-Samani et al.

(10) Patent No.: US 11,905,588 B2
(45) Date of Patent: Feb. 20, 2024

(54) ADDITIVE NANOMANUFACTURING SYSTEM AND METHOD

(71) Applicant: AUBURN UNIVERSITY, Auburn, AL (US)

(72) Inventors: Masoud Mahjouri-Samani, Auburn, AL (US); Nima Shamsaei, Auburn, AL (US)

(73) Assignee: AUBURN UNIVERSITY, Auburn, AL (US)

(*) Notice: Subject to any disclaimer, the term of this patent is extended or adjusted under 35 U.S.C. 154(b) by 666 days.

(21) Appl. No.: 16/899,765

(22) Filed: Jun. 12, 2020

(65) Prior Publication Data
US 2020/0391405 A1 Dec. 17, 2020

Related U.S. Application Data

(60) Provisional application No. 62/860,467, filed on Jun. 12, 2019.

(51) Int. Cl.
*C23C 14/22* (2006.01)
*B33Y 10/00* (2015.01)
(Continued)

(52) U.S. Cl.
CPC ............ *C23C 14/228* (2013.01); *B22F 10/25* (2021.01); *B22F 10/34* (2021.01); *B22F 12/53* (2021.01); *B22F 12/70* (2021.01); *B23K 26/144* (2015.10); *B23K 26/1437* (2015.10); *B23K 26/1464* (2013.01); *B23K 26/1482* (2013.01);
(Continued)

(58) Field of Classification Search
None
See application file for complete search history.

(56) References Cited

U.S. PATENT DOCUMENTS 4,556,416 A * 12/1985 Kamijo ................. C01B 21/068
423/350
6,113,751 A * 9/2000 Morgenthaler ......... H01L 31/18
204/192.12
(Continued)

FOREIGN PATENT DOCUMENTS

JP 2010133019 A * 6/2010
JP 2010133019 A 6/2010

OTHER PUBLICATIONS

PCT Search Report and Written Opinion for PCT/US2020/037413, completed Sep. 21, 2020.

*Primary Examiner* — William J Levicky
*Assistant Examiner* — Adam M Eckardt
(74) *Attorney, Agent, or Firm* — Barnes & Thornburg LLP

(57) ABSTRACT

A device including a chamber and a nozzle detachably connected to the chamber, the nozzle defining an aperture, a target carousel disposed within the chamber, a first laser configured to generate a first beam directed toward the target carousel to perform in-situ ablation to form a laser plume, a gas flow system configured to supply gas into the chamber, such that the gas interacts with the laser plume and causes condensation and formation of nanoparticles, and a second laser configured to generate a second beam directed through the interior of the chamber, through the aperture of the nozzle, and toward a substrate disposed outside the device, the second laser beam configured to sinter and crystalize on the substrate the nanoparticles exiting the nozzle.

20 Claims, 8 Drawing Sheets

(51) Int. Cl.
*B33Y 30/00* (2015.01)
*B23K 26/14* (2014.01)
*B23K 26/144* (2014.01)
*B23K 26/36* (2014.01)
*B28B 1/00* (2006.01)
*B22F 10/25* (2021.01)
*B22F 12/53* (2021.01)
*B22F 12/70* (2021.01)
*B22F 10/34* (2021.01)
*B23K 103/00* (2006.01)
*B22F 12/44* (2021.01)
*B22F 12/90* (2021.01)

(52) U.S. Cl.
CPC .............. *B23K 26/36* (2013.01); *B28B 1/001* (2013.01); *B33Y 10/00* (2014.12); *B33Y 30/00* (2014.12); *B22F 12/44* (2021.01); *B22F 12/90* (2021.01); *B23K 2103/50* (2018.08)

(56) References Cited

U.S. PATENT DOCUMENTS

| | | | | |
|---|---|---|---|---|
| 6,254,940 B1 * | 7/2001 | Pratsinis | ................ | C01B 13/24 |
| | | | | 423/625 |
| 6,491,759 B1 * | 12/2002 | Christen | .............. | B01J 19/0046 |
| | | | | 118/723 VE |
| 8,367,525 B2 | 2/2013 | Jacobson et al. | | |
| 11,059,128 B2 * | 7/2021 | Darwish | .............. | B23K 26/032 |
| 2014/0272198 A1 * | 9/2014 | Bowden | .............. | B23K 26/0869 |
| | | | | 118/697 |
| 2015/0321255 A1 * | 11/2015 | Colin | ..................... | B22F 10/34 |
| | | | | 219/76.12 |

* cited by examiner

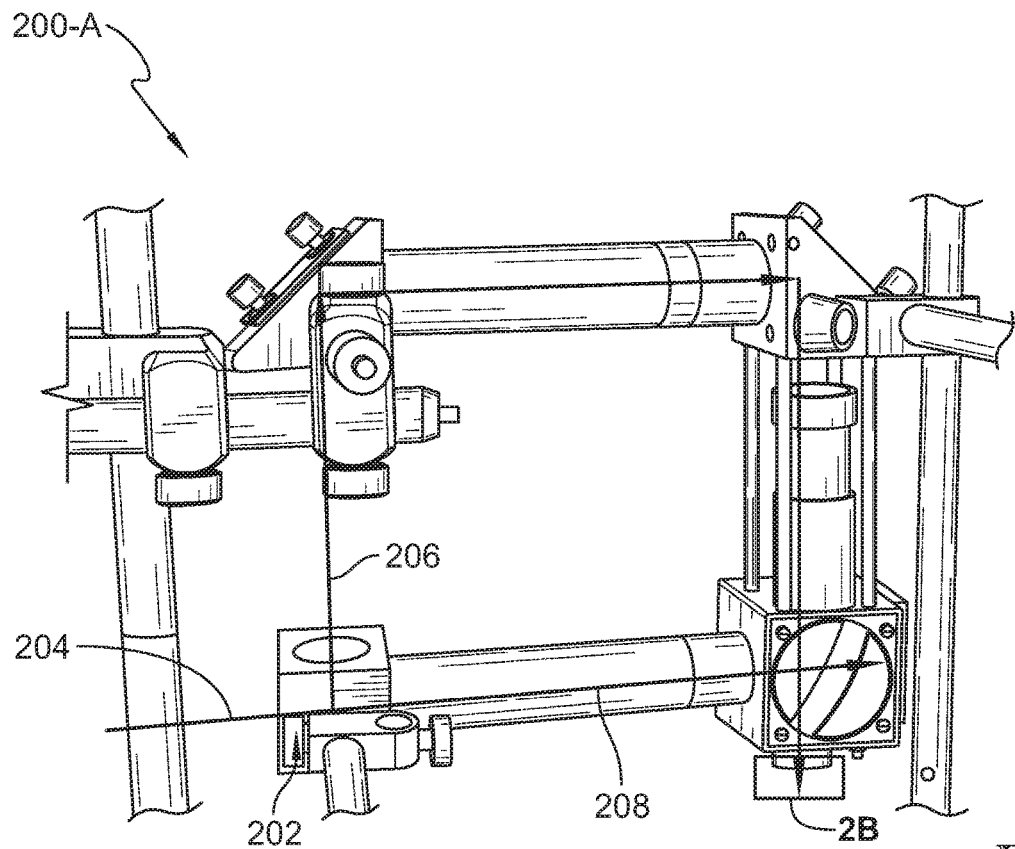
FIG. 2A
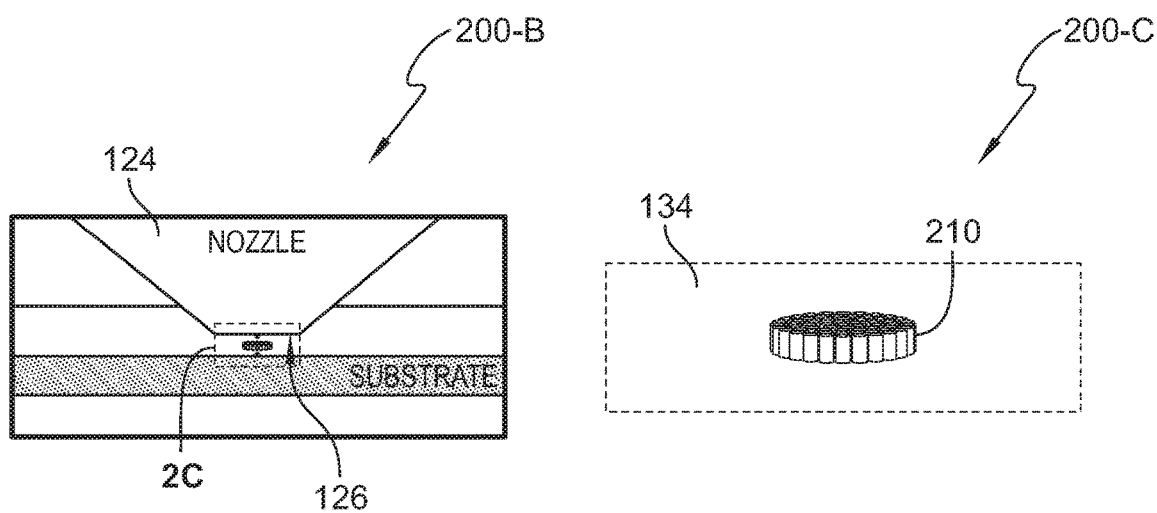
FIG. 2B
FIG. 2C

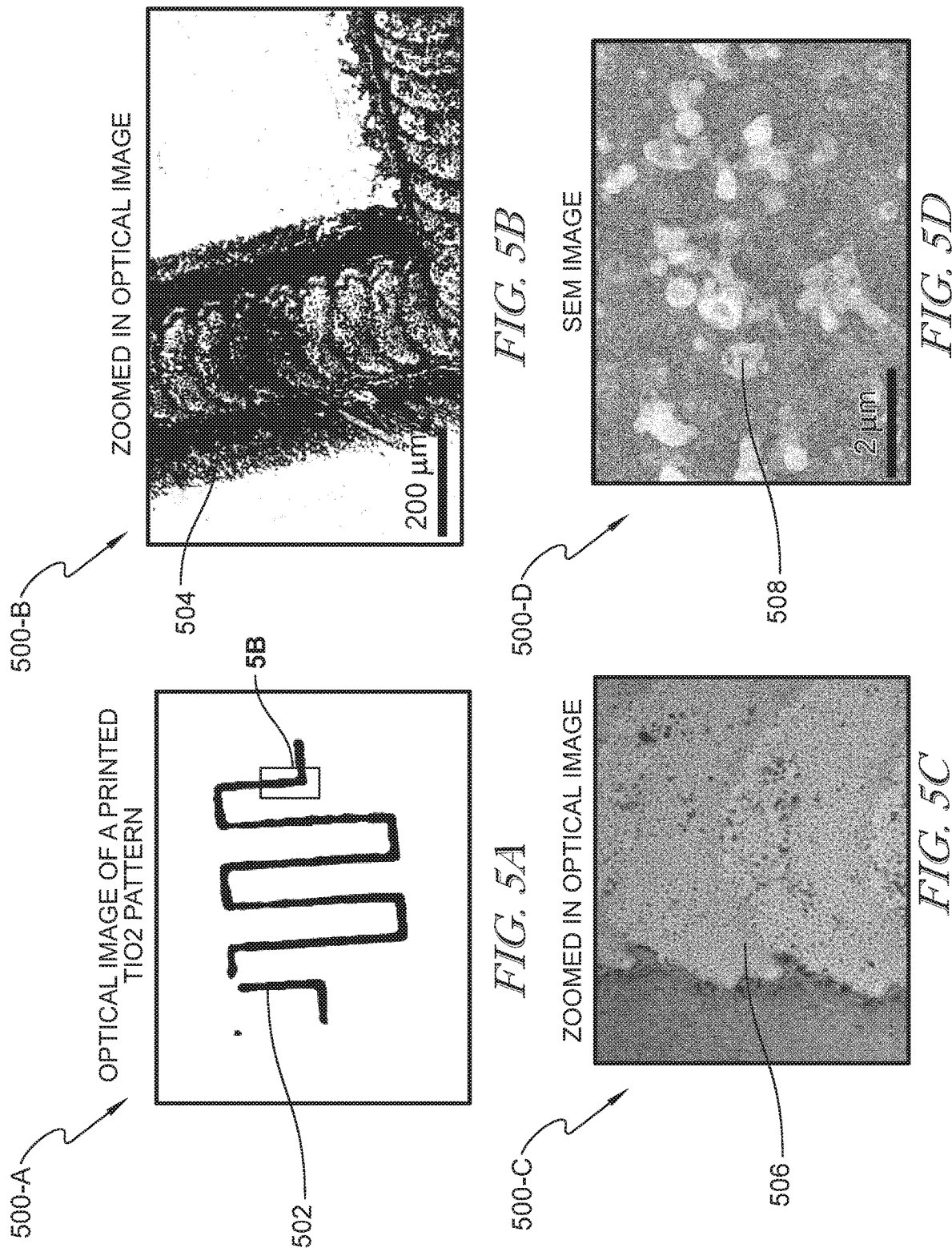

ADDITIVE NANOMANUFACTURING SYSTEM AND METHOD

CROSS-REFERENCE TO RELATED APPLICATIONS

This application claims the benefit under 35 U.S.C. § 119(e) of U.S. Provisional Application Ser. No. 62/860,467, filed on Jun. 12, 2019, the entire disclosure of which is incorporated herein by reference.

TECHNICAL FIELD

The present disclosure generally relates to systems and methods for additive manufacturing.

BACKGROUND

Additive manufacturing has been adopted as a versatile approach for layer-by-layer printing of a wide range of two- and three-dimensional (2D, 3D) structures, devices, and complex geometries. The additive manufacturing process has been widely employed in different industries ranging from electronics to biomedical and aerospace to construction. Since its development, additive manufacturing has significantly evolved over the years with the goal of revolutionizing the manufacturing processes. Fabrication of complex structures and devices via additive manufacturing and materials printing technologies have led to a paradigm shift in engineering design and product realization that can potentially enhance the design flexibility and fabrication speed while reducing cost.

SUMMARY

A device including a chamber and a nozzle detachably connected to the chamber, the nozzle defining an aperture, a target carousel disposed within the chamber, a first laser configured to generate a first beam directed toward the target carousel to perform in-situ ablation to form a laser plume, a gas flow system configured to supply gas into the chamber, such that the gas interacts with the laser plume and causes condensation and formation of nanoparticles, and a second laser configured to generate a second beam directed through the interior of the chamber, through the aperture of the nozzle, and toward a substrate disposed outside the device, the second laser beam configured to sinter and crystalize on the substrate the nanoparticles exiting the nozzle.

A method including generating a first laser beam and directing the generated first laser beam through interior of a chamber toward a target carousel disposed within the chamber to perform in-situ ablation to form a laser plume, supplying gas into the chamber, such that the gas interacts with the laser plume, causes condensation and formation of nanoparticles, and directs a flow of the nanoparticles toward a nozzle detachably coupled to the chamber, the nozzle defining an aperture, and generating a second beam and directing the generated second laser beam through the interior of the chamber and through the aperture of the nozzle and toward a substrate disposed at an outlet of the chamber, the second laser beam configured to sinter and crystalize on the substrate the nanoparticles exiting the nozzle.

A method including initiating in-situ ablation to form a laser plume inside a chamber, supplying gas into the chamber, such that the gas interacts with the laser plume and causes condensation and formation of nanoparticles, directing the nanoparticles through the interior of the chamber and toward a substrate disposed at an outlet of the chamber, and sintering and crystalizing, on the substrate, the nanoparticles exiting the chamber.

BRIEF DESCRIPTION OF THE DRAWINGS

The detailed description particularly refers to the following figures, in which:

FIGS. 2A-2B are block diagrams illustrating an example device for in operando synthesis and sintering of nanoparticles;

FIG. 2C is a block diagram illustrating an example material deposited by the devices of FIGS. 1 and 2A-2B;

FIG. 5A-5D are diagrams illustrating images of multifunctional materials generated using the system of FIGS. 1, 2A-2B, and 4;

DETAILED DESCRIPTION

Figure 1:
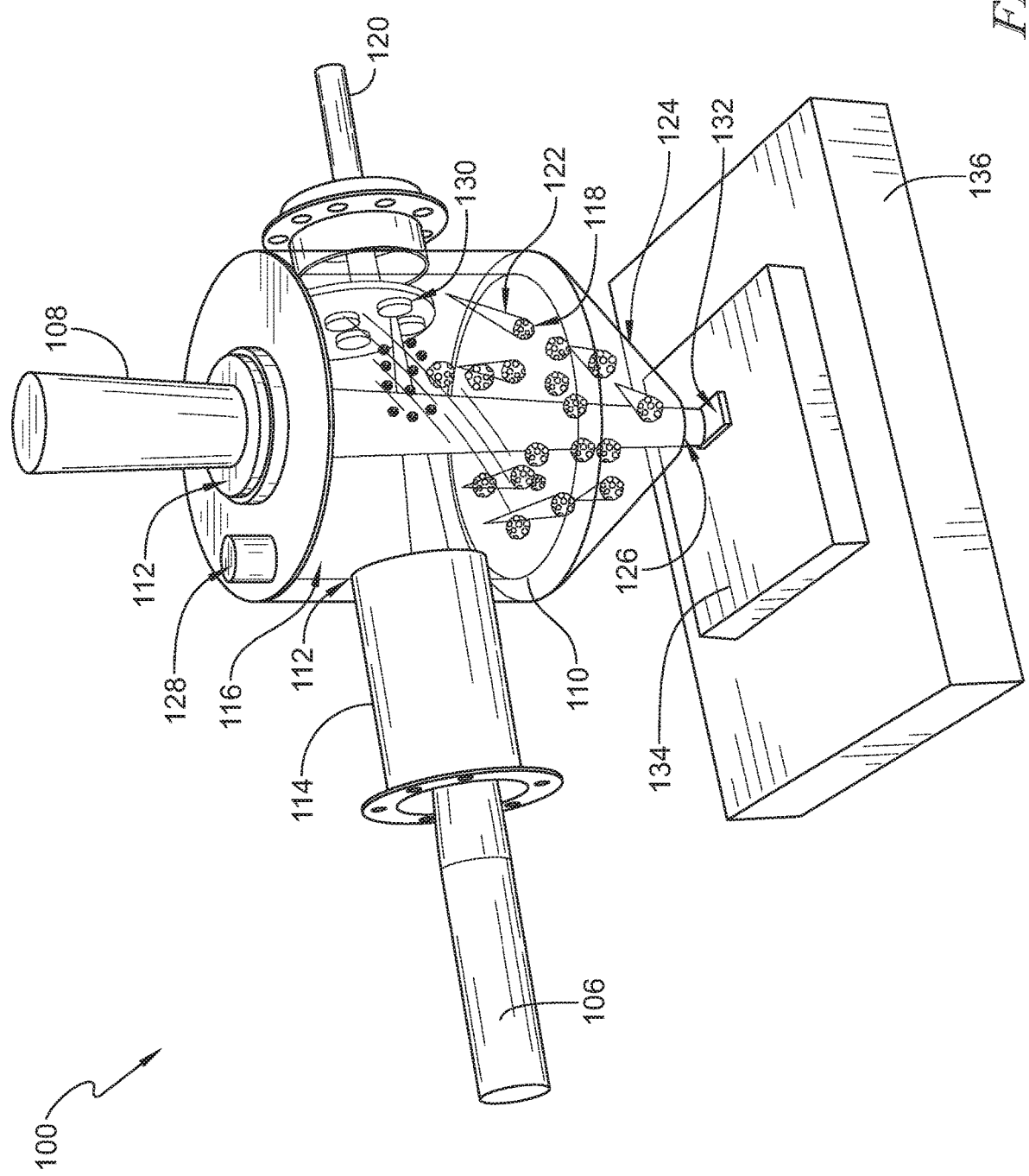
FIG. 1 is a block diagram illustrating an example system for additive nanomanufacturing of multifunctional materials.

While the concepts of the present disclosure are susceptible to various modifications and alternative forms, specific exemplary embodiments are been shown by way of example in the drawings and will be described. It should be understood, however, that there is no intent to limit the concepts of the present disclosure to the particular forms disclosed; on the contrary, the intention is to cover all modifications, equivalents, and alternatives falling within the spirit and scope of the invention as defined by the appended claims.

References in the specification to "one embodiment," "an embodiment," "an illustrative embodiment," etc., indicate that the described embodiment may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C): (A and B); (B and C); (A and C); or (A, B, and C). Similarly, items listed in the form of "at least one of A, B, or C" can mean (A); (B); (C): (A and B); (B and C); (A and C); or (A, B, and C).

The disclosed embodiments may be implemented, in some cases, in hardware, firmware, software, or any combination thereof. The disclosed embodiments may also be implemented as instructions carried by or stored on one or more transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

The growing interests in adopting the additive manufacturing over traditional techniques is attributed to several advantages including fabrication of complex geometry, minimal material waste, design flexibility, cost-effective prototyping, and customization, which are not accessible through conventional fabrication processes. Multifunctional materials may enable smart structures incorporating strain response to generate power, increase stiffness during vibration, or change thermal conductivity to external stimuli. The unique ability to print multifunctional materials (e.g., piezoelectric) directly onto conformal surfaces, for example on an aircraft wing or wearable sensors, makes the additive manufacturing an attractive solution for such applications.

However, hybrid structures and devices (e.g., piezoelectric devices, flexible electronics) are often under cyclic loading and are, thus, susceptible to fatigue failures if imperfections within the material are present, such as lack of fusions (LoFs), entrapped gas pores, surface roughness, and/or weak bounding between two material systems in hybrid structures. Parameters of the additive manufacturing process used to create the hybrid structures, such as laser power and scanning speed, affect a thermal history and microstructural features (including imperfections) of those structures, which, in turn, dictate the mechanical properties including fatigue behavior of the printed part. Existing techniques in the current additive manufacturing technology have challenges that significantly limit their applications in printing hybrid structures and devices with complex functionalities including piezoelectric, optoelectronic, energy conversion, and storage devices.

An improved manufacturing platform includes generating, delivering, and sintering a variety of multifunctional nanoparticles in the gas-phase and at atmospheric pressures to print durable hybrid structures and devices that possess complex functionalities. An additive nanomanufacturing (ANM) method of the present disclosure includes in-situ generation and real-time sintering of multifunctional materials, enabling the formation of durable hybrid structure and patterns with complex functionalities, layer-by-layer. Advantages over existing additive manufacturing technologies include enabling a large choice of nanoscale multifunctional materials spanning from ferroelectric to ferromagnetic and from piezoelectric to phase change materials, allowing in-situ formation and digital delivery of pure fluxes of ligand-free nanoparticle building blocks in the gas-phase at atmospheric pressure, and providing nanoscale precision in the deposition and sintering processes.

FIG. 1 illustrates an example system 100 for additive nanomanufacturing of multifunctional materials. Each of the laser beams 106, 108 enters a chamber 110 via a corresponding one of a plurality of chamber openings 112. Example embodiments of the system 100 include tubes 114 or other structures or devices configured to deliver, direct, or transfer the laser beams 106, 108 to an interior 116 of the chamber 110. As described in reference to at least FIGS. 2A and 3, two laser beams 106, 108 may be generated using a beam splitter that divides a single laser beam into two paths. Of course, other methodologies or approaches to generating and/or delivering each of the laser beams 106, 108 are also contemplated.

A nozzle 124 is detachably or removably coupled to a distal end of the chamber 110 and defines an aperture 126. In an example, the nozzle 124 may be cone-shaped, although, other shapes and configurations, such as but not limited to, bell and spike. Of course, other implementations of the chamber 110 and the nozzle 124, such as the implementations configured to perform the processes described herein, are also contemplated.

A first laser beam 106 of the system 100 initiates an in-situ ablation process 130. The first laser beam 106 is directed to (or pointed in a direction of) a target carousel 120 disposed within the interior 116 of the chamber 110. The target carousel 120 comprises a plurality of targets disposed on a rotatable plate of the carousel. In an example, the targets may comprise solid pellets for formation and assembly of multifunctional structures. The first laser beam 106 may be selectively aligned with a first target of the plurality of targets to initiate the ablation process 130 of a first material of the first target to cause formation of a laser plume of the first material. Further, the first laser beam 106 may be subsequently selectively aligned with a second target of the plurality of targets to perform ablation process 130 of a second material of the second target to cause formation of a corresponding laser plume. Purely as a non-limiting example, the first material may comprise barium titanate (BTO) exhibiting piezoelectric material qualities and the second material may comprise indium tin oxide (ITO) having properties appropriate for forming conductive electrodes.

The in-situ ablation process 130 may comprise an atmospheric pressure pulsed laser ablation (PLA) process and may be configured to cause the nanoparticle 118 building blocks to generate a pure flux such that the nanoparticles 118 may be integrated into hybrid functional structures in real time.

The system 100 comprises one or more gas inlets 128 disposed about a proximal end of the chamber 110 and configured to deliver a flow of gas into the interior 116 of the chamber 110. The ablation of a given material disposed on the target carousel 120 in a flow of gas causes formation of a nanoparticle stream 122. Accordingly, the system 100 facilitates interaction of laser-generated plume with background gas that condenses the plasma resulting in the formation of aggregates and nanoparticle building blocks. Moreover, the carrier gas flow and ablation rates determine the delivery of pure flux of nanoparticle onto the substrate.

The particles 118 exit the interior 116 of the chamber 110 through the aperture 126 of the nozzle 124, the aperture 126 having a predefined diameter. A second laser beam 108 of the system 100 performs real-time sintering 132 of a plurality of particles 118 generated during the in-situ ablation process 130. The particles 118 exiting the chamber 110 are sintered 132 in real-time as the particles 118 land on a substrate 134 allowing the fabrication of a disk of crystalline multifunctional material pulse-by-pulse. The crystallization and interface interaction of nanoparticles under controlled laser sintering conditions is such that the sintering laser parameters govern the crystallization dynamics and phase evolution of the amorphous nanoparticles as the particles land onto the surface of the substrate. Further, the subsequent amorphous nanoparticles interact with the previously sintered blocks leading to epitaxial growth of larger crystalline structures.

In some examples, a thickness of the fabricated disk may be controlled by controlling a number of deposition/sintering pulses. Additionally or alternatively, a manual Z-stage 136 may be used to readjust a focal point of the sintering laser 108 for depositing disks of increased thicknesses. As such, the ANM system and process of the present disclosure may be used to fabricate high-quality durable multifunctional hybrid structures.

FIG. 2A illustrates an example device 200-A for in operando synthesis and sintering of nanoparticles. A beam splitter 202 divides an excimer laser beam 204 into two laser paths (beams) 206, 208. An example beam splitter 202 comprises an optical device, such as a plate or a cube, configured to split incident light at a predetermined ratio into two separate beams. The beam splitter 202 may comprise a thin, flat glass plate, wherein a body of the plate is coated about a first surface with a beamsplitting coating and/or coated about a second surface with an anti-reflection coating to remove, or minimize, unwanted reflection. An excimer laser beam comprises a laser light beam having a wavelength within an ultraviolet range and being generated by way of temporary bonds between molecules of a noble gas (e.g., argon, krypton, or xenon) and a reactive gas, such as fluorine and chlorine, formed under electrical excitation.

Figure 3:
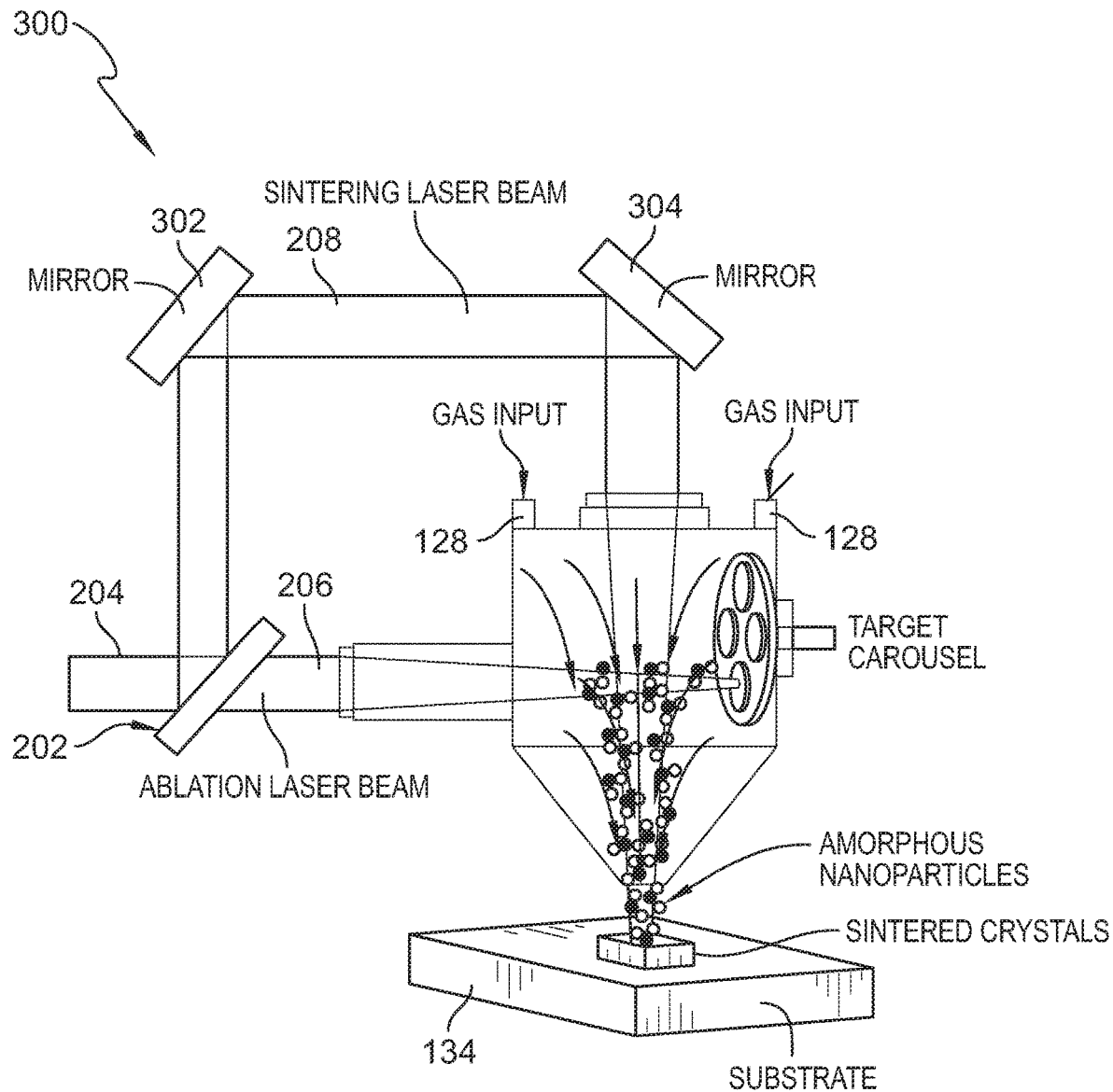
FIG. 3 is a block diagram illustrating an example implementation of additive nanomanufacturing using a beam splitter.

A first laser beam 206 performs the in-situ ablation process and a second laser beam 208 performs real-time sintering of the generated particles. As illustrated in FIG. 3, the ablation of the target (e.g., ZnO) in a flow of gas (e.g., argon) causes formation of a plurality of nanoparticles. The gas stream flow then carries (see, e.g., FIG. 2B) the generated nanoparticles toward the aperture 126 of the nozzle 124, the aperture 126 having a predefined diameter (e.g., ~300 μm). FIG. 2B illustrates an example implementation 200-C wherein the nanoparticles 118 are sintered in real-time upon landing on, or being deposited onto, the substrate 134. FIG. 2C illustrates an example formation 200-C comprising a fabricated material deposit 210 of the sintered particles, such as, having a predefined thickness and shape. While the fabrication of a disk of a crystalline material is shown, other shapes, thicknesses, and . The thickness of the disk was simply controlled by the number of deposition/sintering pulses in the experiment. A manual Z-stage may be used in this experiment in order to readjust the sintering laser focal point during the deposition of the thicker disks.

Figure 4:
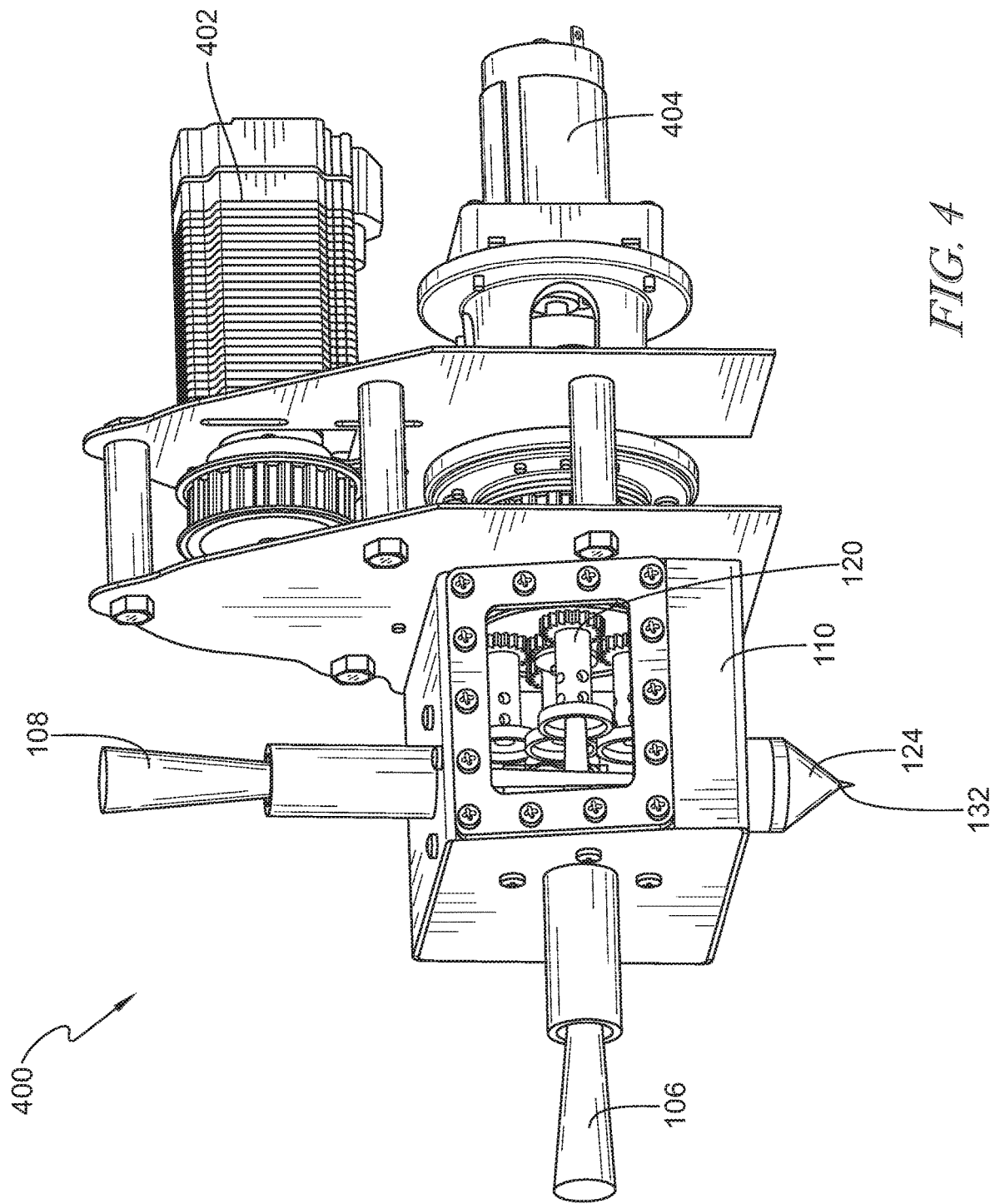
FIG. 4 is a block diagram illustrating an example an example control system for the additive nanomanufacturing system of FIGS. 1 and 2A-2B.

FIG. 4 illustrates an example control system 400 for in operando synthesis and sintering of nanoparticles 118. The control system 400 includes a control logic device 402 communicatively coupled to a motor 404. The motor 404 is operatively coupled to the target carousel 120, such that, in response to a corresponding signal or command, the motor 404 operates to initiate, continue, or prevent rotation of targets and/or target materials of the target carousel 120 to initiate, continue, or prevent alignment of the target and/or target material with the ablation laser beam 106 to initiate, continue, or prevent the ablation process 130.

In some instances, the control logic device 402 and the motor 404 are communicatively coupled to at least one of a plurality of sensors that comprise one or more sensors related to monitoring and controlling operation of the additive nanomanufacturing system 100 of the present disclosure, such as, but not limited to, sensors configured to sense position of the target carousel 120, operating parameters of the ablation process 130, operating parameters of the sintering process 132, and operating parameters of the flow of background gas. At least one of the sensors may transmit data to the control logic device 402. Once received, the control logic device 402 may, based on the sensor data, operate the motor 404 to initiate, continue, or prevent rotation of the target carousel 120 and/or initiate, continue, or prevent the ablation process 130 and/or initiate, continue, or prevent the nanoparticle 118 formation process and/or initiate, continue, or prevent the sintering process 132.

Upon completion of the sintering process 132 on a currently deposited/fabricated layer, the control logic device 402 is configured to position the layers in a desired relative position with respect to the nozzle 124 and/or the aperture 126 of the nozzle 124 to initiate printing of subsequent layers of the multifunctional material. For example, the control logic device 402 is configured to initiate, continue, or prevent moving of the substrate 134 disposed on the movable stage 136 and/or moving the previously deposited/fabricated layers or structures.

The control logic device 402 includes a processor, an I/O subsystem, one or more data storage devices, and communication circuitry. It will be appreciated that the control logic device 402 may include other or additional components, such as those commonly found in a typical computing device (e.g., various input/output devices and/or other components), in other embodiments. Additionally, in some embodiments, one or more of the illustrative components may be incorporated in, or otherwise form a portion of, another component. The control logic device 402 may be embodied as any type of device or collection of devices capable of performing the described various compute functions. In some embodiments, the control logic device 402 may be embodied as a single device, such as an integrated circuit, an embedded system, a field-programmable gate array (FPGA), a system-on-a-chip (SOC), an application-specific integrated circuit (ASIC), reconfigurable hardware or hardware circuitry, or other specialized hardware to facilitate performance of the functions described herein. In some embodiments, the control logic device 402 may include, or may be embodied as, one or more processors (i.e., one or more central processing units (CPUs)) and memory.

The processor(s) of the control logic device 402 may be embodied as any type of processor capable of performing the described functions. For example, the processor(s) of the control logic device 402 may be embodied as one or more single-core processors, one or more multi-core processors, a digital signal processor, a microcontroller, or other processor or processing/controlling circuit(s). In some embodiments, the processor(s) of the control logic device 402 may be embodied as, include, or otherwise be coupled to an FPGA, an ASIC, reconfigurable hardware or hardware circuitry, or other specialized hardware to facilitate performance of the described functions.

The memory of the control logic device 402 may be embodied as any type of volatile (e.g., dynamic random access memory (DRAM), etc.) or non-volatile memory or data storage capable of performing the described functions. It will be appreciated that the memory of the control logic device 402 may include main memory (i.e., a primary memory) and/or cache memory (i.e., memory that can be accessed more quickly than the main memory). Volatile memory may be a storage medium that requires power to maintain the state of data stored by the medium. Non-limiting examples of volatile memory may include various types of random access memory (RAM), such as DRAM or static random access memory (SRAM).

The processor of the control logic device 402 is communicatively coupled to other components of the control logic device 402 via an I/O subsystem, which may be embodied as circuitry and/or components to facilitate input/output operations with the processor, the memory, and other components of the control logic device 402. For example, the I/O subsystem may be embodied as, or otherwise include, memory controller hubs, input/output control hubs, integrated sensor hubs, firmware devices, communication links (e.g., point-to-point links, bus links, wires, cables, light guides, printed circuit board traces, etc.), and/or other components and subsystems to facilitate the input/output operations. In some embodiments, the I/O subsystem may form a portion of a system-on-a-chip (SoC) and be incorporated, along with the processor and the memory and/or other components of the control logic device 402, on a single integrated circuit chip.

The one or more data storage devices of the control logic device 402 may be embodied as any type of storage device(s) configured for short-term or long-term storage of data, such as, for example, memory devices and circuits, memory cards, hard disk drives, solid-state drives, or other data storage devices. Each data storage device of the control logic device 402 may include a system partition that stores data and firmware code for the data storage device of the control logic device 402. Each data storage device of the control logic device 402 may also include an operating system partition that stores data files and executables for an operating system.

Moreover, communication circuitry may be embodied as any communication circuit, device, or collection thereof, capable of enabling communications between the control logic device 402 and the motor 404, as well as any network communication enabling devices, such as a gateway, an access point, other network switches/routers, etc., to allow ingress/egress of network traffic. Accordingly, the communication circuitry of the control logic device 402 may be configured to use any one or more communication technologies (e.g., wireless or wired communication technologies) and associated protocols (e.g., Ethernet, Bluetooth®, Wi-Fi®, WiMAX, LTE, 5G, etc.) to effect such communication.

It should be appreciated that, in some embodiments, the communication circuitry of the control logic device 402 may include specialized circuitry, hardware, or combination thereof to perform pipeline logic (e.g., hardware algorithms) for performing the functions described herein, including processing network packets (e.g., parse received network packets, determine destination computing devices for each received network packets, forward the network packets to a particular buffer queue of a respective host buffer of the control logic device 402, etc.), performing computational functions, etc.

In some embodiments, performance of one or more of the functions of the described communication circuitry of the control logic device 402 may be performed by specialized circuitry, hardware, or combination thereof of the communication circuitry of the control logic device 402, which may be embodied as a system-on-a-chip (SoC) or otherwise form a portion of a SoC of the control logic device 402 (e.g., incorporated on a single integrated circuit chip along with a processor, the memory, and/or other components of the control system 400). Alternatively, the specialized circuitry, hardware, or combination thereof may be embodied as one or more discrete processing units of the control system 400, each of which may be capable of performing one or more of the described functions.

FIGS. 5A-5D illustrate images 500-A, 500-B, 500-C, and 500-D of multifunctional materials generated using the additive nanomanufacturing system 100 of the present disclosure. The optical image 500-A illustrates an example pattern 502 of titanium dioxide ($TiO_2$) material printed using the additive nanomanufacturing system 100 of the present disclosure. The optical image 500-B is representative of a detailed view of a portion of the material structure of the pattern 502. As can be observed in the optical image 500-B, the material structure of the pattern 502 is substantially solid. The optical image 500-C is representative of a detailed view of a portion 506 of the material structure captured in the optical image 500-B. The image 500-D is a scanning electron microscope (SEM) image of a portion of the material structure captured in the optical images 500-B and 500-C. As indicated, for example, using element 508, the amorphous nanoparticles 118, generated and transferred to the substrate 134 using the additive nanomanufacturing system 100 of the present disclosure, are sintered/crystallized into a predefined crystalline phase and integrated into a larger multifunctional material structure.

Figure 6A:
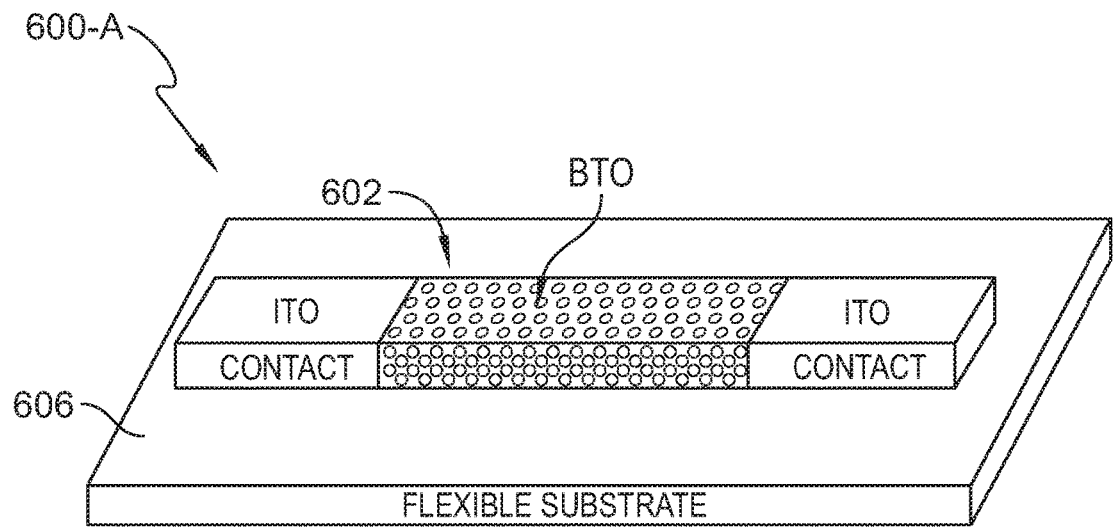
FIGS. 6A and 6B are block diagrams illustrating structures formed using additive nanomanufacturing devices of FIGS. 1, 2A-2B. 3, and 4A.
Figure 6B:
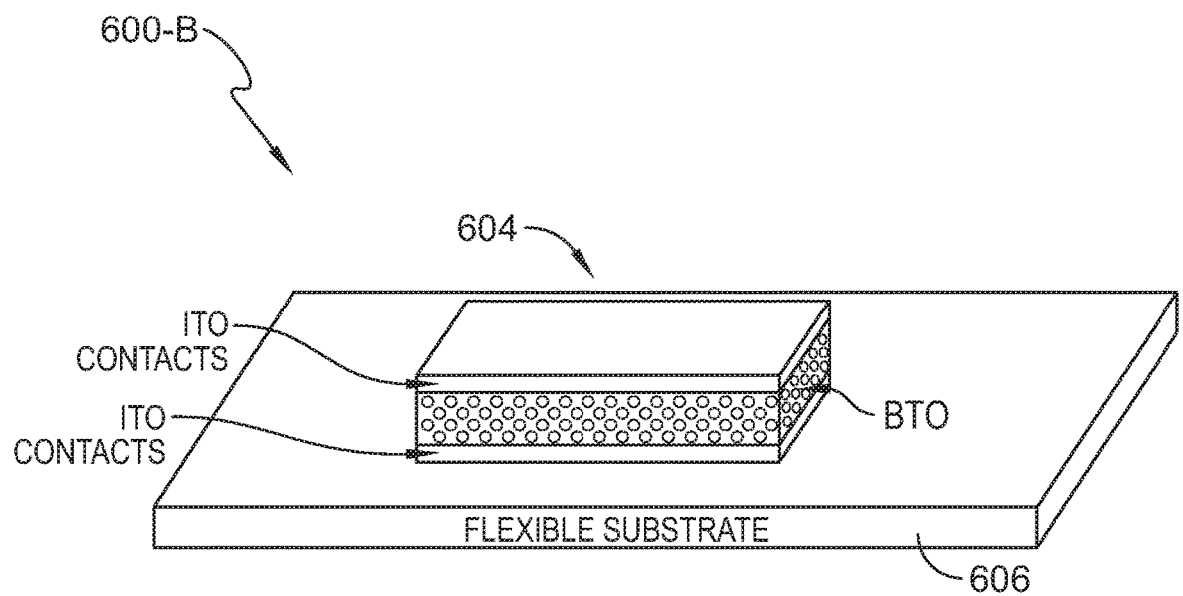

FIGS. 6A and 6B illustrate example layouts 600-A and 600-B, respectively, of structures 602 and 604 formed using an additive nanomanufacturing device of the present disclosure. The structures 602, 604 may be formed on a substrate 606. The substrate 606 may be a flexible substrate and may be same or different from the substrate 134 described in reference to FIG. 1. Each of the structures 602, 604 comprises a hybrid ITO/BTO structure, wherein the structure 602 has a lateral orientation and the structure 604 has a vertical orientation.

Figure 7:
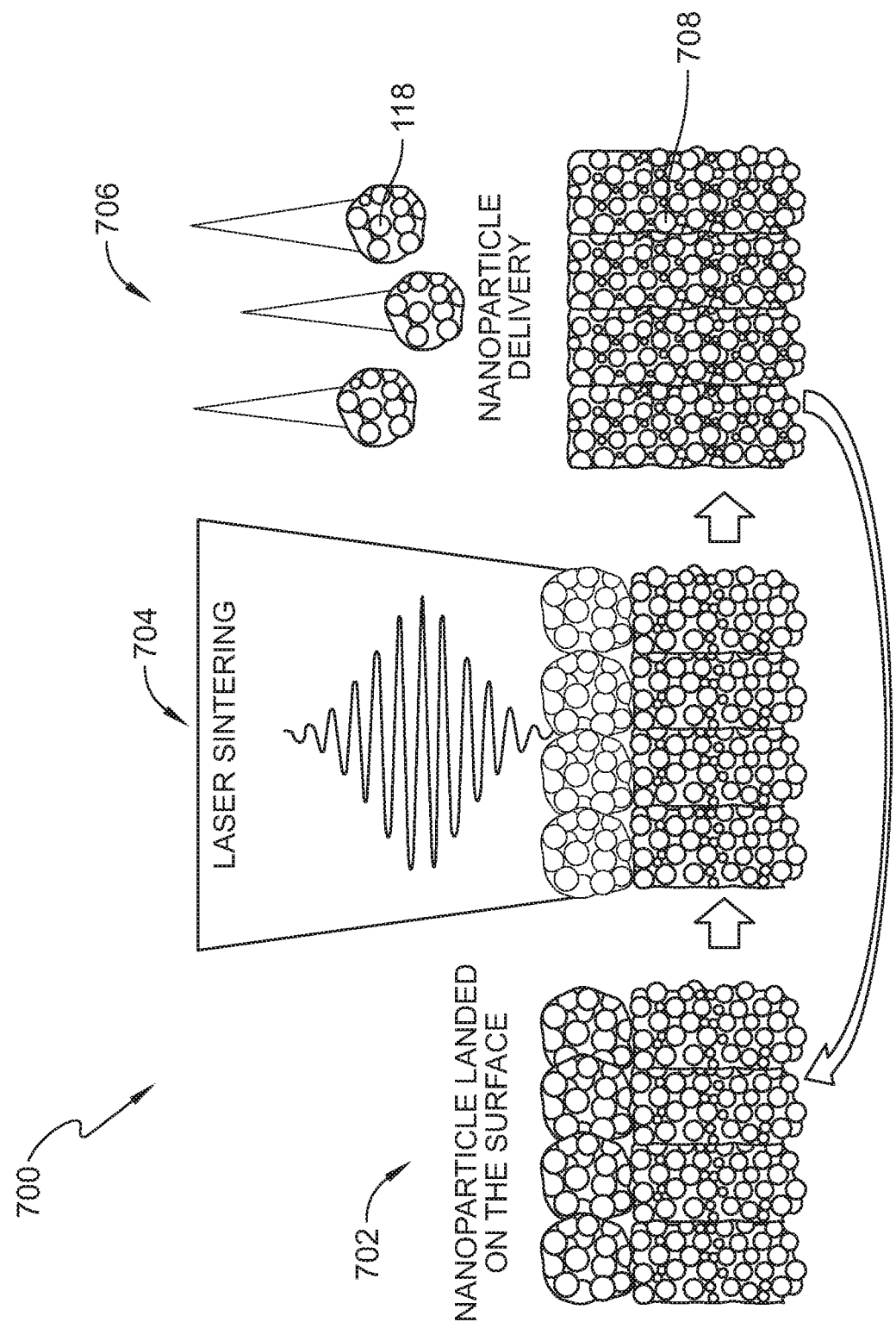
FIG. 7 is a block diagram illustrating an example implementation of in-situ sequential deposition and in operando sintering of nanoparticle building blocks.

FIG. 7 illustrates an example implementation 700 of in-situ sequential deposition and in operando sintering of nanoparticle building blocks. is the sequential deposition and sintering/crystallization process. During a first phase 702 of the sequential process implementation, the amorphous nanoparticles 118 may be delivered and deposited onto a substrate. A laser sintering pulses drive, during a second phase 704, the landed nanoparticles into a specific crystalline phase and integrate into larger structures depending on the laser energy and repatriation rates. As the process continues 706, the subsequent deposition of amorphous nanoparticles 118 land on the previously deposited and crystallized nanoparticles 708 in a layer-by-layer manner. The crystalline phases of the first set of the crystallized nanoparticles may induce, or otherwise affect, the phase transformation of the subsequent amorphous particles. This sequential deposition and sintering/crystallization process causes an interface interaction between the undercoordinated bonds on the surface of crystalline and amorphous nanoparticles that may result in attaching to each other and forming crystallized architectures through nucleation and growth or induced crystallization processes.

Figure 8:
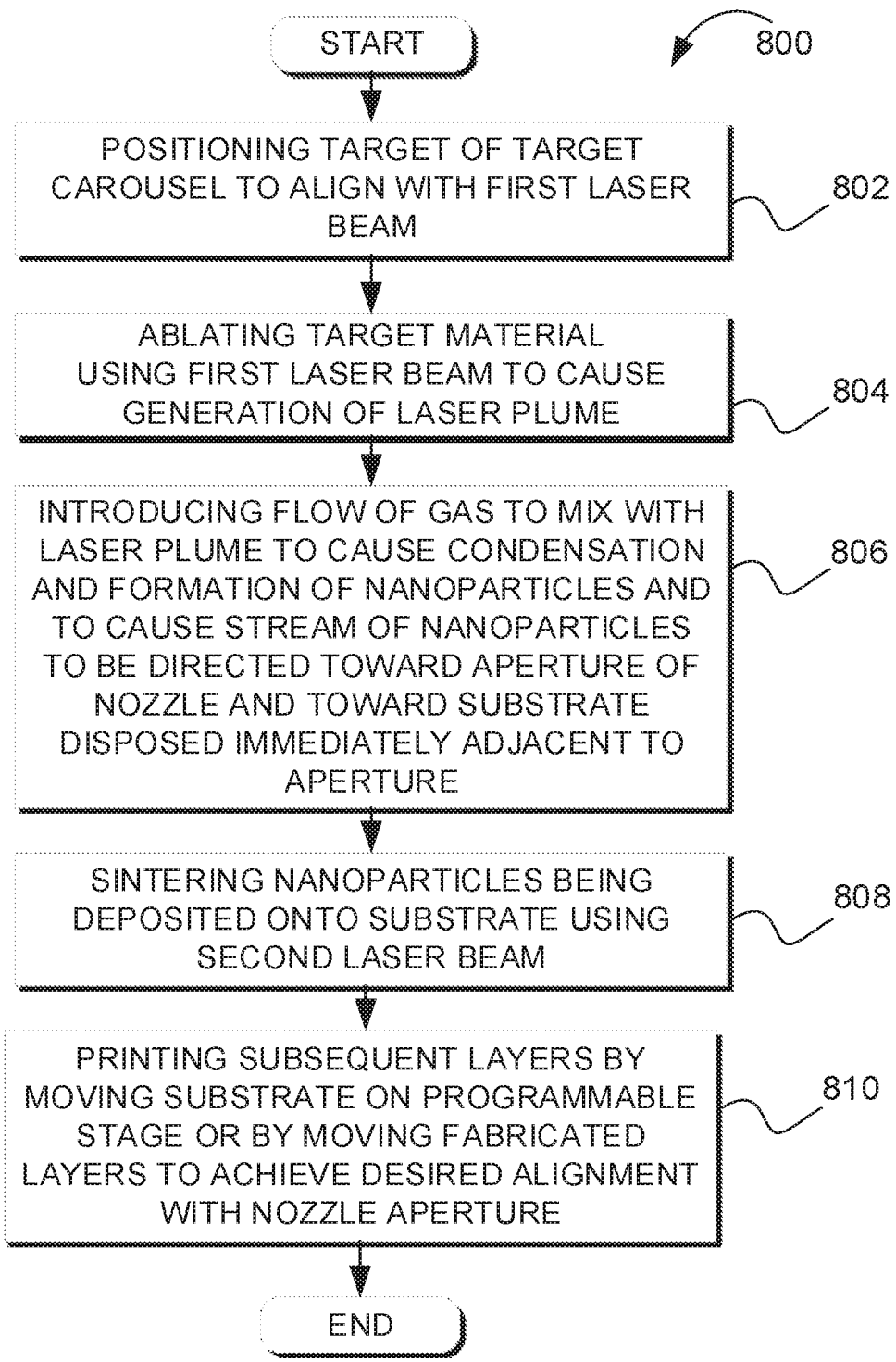
FIG. 8 is a block diagram illustrating an example process flow for additive nanomanufacturing of multifunctional materials.

FIG. 8 illustrates an example process 800 for additive nanomanufacturing of multifunctional materials. The process 800 may begin at block 802 where the control logic device 402 of the additive manufacturing device of the present disclosure positions one of the plurality of targets of the target carousel 120 in alignment with the first laser beam 106. The control logic device 402, at block 804, initiates, using the first laser beam, ablation of a target material disposed on the target of the target carousel, such that the ablation process causes generation of a laser plume. At block 806, the control logic device 402 introduces a flow of gas to mix with the laser plume to cause condensation and formation of the nanoparticles 118. The gas flow may be configured to direct the formed nanoparticles 118 toward the aperture 126 of the nozzle 124 and toward the substrate 134 disposed immediately adjacent the aperture 126.

At block 808, the control logic device 402 causes sintering, using the second laser beam, of the nanoparticles 118 in response to the nanoparticles 118 being deposited onto the substrate 134. The control logic device 402, at block 810, positions the previously deposited/fabricated layers in a desired relative position with respect to the nozzle 124 and/or the aperture 126 of the nozzle 124 to initiate printing of subsequent layers of the multifunctional material. For example, the control logic device 402 moves the substrate 134 disposed on the movable stage 136 and/or moves the previously deposited/fabricated layers or structures. The process 800 may then end. In some examples, the process 800 may be repeated in response to a predefined signal or command.

Existing processes do not support fabricating multifunctional materials and devices. The ANM process of the present disclosure relies on the nonequilibrium processes for controlled synthesis and assembly of nanoparticle building blocks into hybrid functional structures and understanding their process-structure-properties relationships. Such relationships are essential in fabricating devices with enhanced structural integrity, functionality, and durability throughout their lifecycle. This transformative approach enables the next-generation disruptive technologies spanning from energy storage and conversion to optoelectronics and photonics.

While the disclosure has been illustrated and described in detail in the drawings and foregoing description, such an illustration and description is to be considered as exemplary and not restrictive in character, it being understood that only illustrative embodiments have been shown and described and that all changes and modifications that come within the spirit of the disclosure are desired to be protected.

There are a plurality of advantages of the present disclosure arising from the various features of the method, apparatus, and system described herein. It will be noted that alternative embodiments of the method, apparatus, and system of the present disclosure may not include all of the features described yet still benefit from at least some of the advantages of such features. Those of ordinary skill in the art may readily devise their own implementations of the method, apparatus, and system that incorporate one or more of the features of the present invention and fall within the spirit and scope of the present disclosure as defined by the appended claims.

The invention claim is:

1. A device comprising:
a chamber defined by a housing including a top plate and a nozzle arranged opposite the top plate, the nozzle including at least one aperture;
one or more targets disposed within the chamber;
a first laser configured to generate a first beam directed through the housing and into the chamber toward the one or more targets to perform in-situ ablation to form a plume, the first beam being directed through the housing opposite of the one or more targets;
a gas flow system configured to supply gas into the chamber and flow through the chamber, such that the gas interacts with the plume and causes the formation of nanoparticles that flow out of the chamber through at least one aperture at atmospheric pressure; and
a second laser arranged above the top plate of the housing and configured to generate a second beam directed through the top plate and into the chamber, through the at least one aperture of the nozzle, and toward a substrate disposed outside the housing at atmospheric pressure, the second laser beam configured to sinter the nanoparticles passing through the aperture on the substrate.

2. The device of claim 1, wherein a target carousel comprises a plate including a plurality of targets including the one or more targets about a first side of the plate and a shaft about a second side of the plate opposite the first side, and wherein the first beam performs the in-situ ablation to form the laser plume by focusing on at least one of the targets.

3. The device of claim 2, wherein each target comprises a solid pellet.

4. The device of claim 1, further comprising a control logic device configured to control thermalization dynamics of the plume and the stream of the nanoparticles by selectively adjusting respective fluence of each of the first and second lasers, repetition rate, and a flow rate of the gas.

5. The device of claim 1, wherein the housing includes an outer wall, the top end plate arranged on a top end of the outer wall, wherein the nozzle is detachably coupled to a bottom end of the outer circumferential wall opposite the top end, and wherein the first beam extends through the outer wall.

6. The device of claim 5, wherein the one or more targets are arranged opposite a location at which the first beam extends through the outer wall such that the first beam extends traversely across the housing to the one or more targets, and wherein the second beam extends through the top end plate and opposite the nozzle.

7. The device of claim 6, wherein the top end plate further includes one or more gas inlets through which the gas is supplied into the chamber, and wherein the gas is configured to flow from the gas inlets, through the chamber, and to the at least one aperture of the nozzle.

8. A method comprising:
directing a first laser toward a target disposed within a chamber to perform in-situ ablation to form a laser plume, the chamber including a nozzle having an aperture;
supplying gas into the chamber, such that the gas interacts with the laser plume, causing the formation of nanoparticles, and directs a flow of the nanoparticles toward and through the aperture of the nozzle, wherein the gas increases pressure in the chamber to a first pressure, wherein the nanoparticles are jetted through the aperture of the nozzle; and
directing a second laser beam toward a substrate disposed at an outlet of the chamber, the second laser beam configured to sinter on the substrate the nanoparticles exiting the nozzle, wherein the substrate is arranged in an environment outside of the chamber and maintained at a second pressure,
wherein the second pressure is atmospheric pressure, and wherein the first pressure is greater than the second pressure.

9. The method of claim 8, wherein the target comprises a plate including a plurality of targets about a first side of the plate and a shaft about a second side of the plate opposite the first side, and wherein the first laser beam performs the in-situ ablation to form the laser plume by focusing on at least one of the targets.

10. The method of claim 9, wherein each target comprises a solid pellet.

11. The method of claim 10, wherein at least two pellets comprise different materials from one another, such that consecutively performing, for each of the materials, the in-situ ablation to form the laser plume, supplying the gas to cause condensation and formation of the nanoparticles, and sintering the nanoparticles on the substrate causes formation of a multifunctional material.

12. The method of claim 11, wherein the multifunctional material comprises a hybrid material including a composite having at least two constituent materials.

13. The method of claim 8, wherein the nanoparticles exiting the chamber comprise a stream and are carried toward the substrate by a flow of a carrier gas and a deferential pressure created by first pressure being greater than the second pressure.

14. The method of claim 13, wherein the the nozzle is detachably coupled to the chamber.

15. A method comprising:
   initiating in-situ ablation of a target to form a plume inside a chamber;
   supplying gas into the chamber, such that the gas interacts with the plume and causes formation of nanoparticles;
   directing the nanoparticles through the interior of the chamber and toward a substrate disposed at an outlet of the chamber and arranged in an environment outside of the chamber and maintained at atmospheric pressure; and
   sintering, on the substrate, the nanoparticles exiting the chamber.

16. The method of claim 15, wherein initiating in-situ ablation includes generating a first laser beam and directing the generated first laser beam through interior of the chamber toward the target.

17. The method of claim 16, wherein the target comprises a plate including a plurality of targets about a first side of the plate and a shaft about a second side of the plate opposite the first side, and wherein initiating in-situ ablation includes generating directing the generated first laser beam to focus on at least one of the targets.

18. The method of claim 17, wherein each target comprises a solid pellet.

19. The method of claim 18, wherein at least two pellets comprise different materials from one another, such that consecutively initiating, for each of the materials, the in-situ ablation to form the laser plume, supplying the gas to cause formation of the nanoparticles, directing the nanoparticles, and sintering the nanoparticles on the substrate causes formation of a multifunctional material.

20. The method of claim 19, wherein the multifunctional material comprises a hybrid material including a composite having at least two constituent materials.

* * * * *